(12) United States Patent
Lewison et al.

(10) Patent No.: US 11,940,271 B2
(45) Date of Patent: Mar. 26, 2024

(54) HIGH POWER DEVICE FAULT LOCALIZATION VIA DIE SURFACE CONTOURING

(71) Applicant: International Business Machines Corporation, Armonk, NY (US)

(72) Inventors: David J. Lewison, LaGrangeville, NY (US); Jay A. Bunt, Esopus, NY (US); Frank L. Pompeo, Redding, CT (US); Richard Walter Oldrey, Clintondale, NY (US); John D. Sylvestri, Poughkeepsie, NY (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 16/950,855

(22) Filed: Nov. 17, 2020

(65) Prior Publication Data

US 2022/0155049 A1    May 19, 2022

(51) Int. Cl.
*G01B 5/20*   (2006.01)
*G01B 5/06*   (2006.01)
*G01B 5/30*   (2006.01)
*H01L 21/67*  (2006.01)

(52) U.S. Cl.
CPC ............. *G01B 5/20* (2013.01); *G01B 5/06* (2013.01); *G01B 5/30* (2013.01); *H01L 21/67253* (2013.01)

(58) Field of Classification Search
CPC .... G01B 5/20; G01B 5/06; G01B 5/30; H01L 21/67253; H01L 21/02; H01L 21/82; H01L 22/14; H01L 22/20; H01L 23/367; G01R 31/2898; G01R 31/08
See application file for complete search history.

(56) References Cited

U.S. PATENT DOCUMENTS

| | | |
|---|---|---|
| 5,698,474 A | 12/1997 | Hurley |
| 6,790,125 B2 | 9/2004 | Kane |
| 7,563,651 B2 | 7/2009 | Kawata |
| 8,424,594 B2 | 4/2013 | Canfield |
| 9,247,636 B2 | 1/2016 | Hoffmeyer |
| 9,465,049 B2 | 10/2016 | Colvin |
| 2003/0115739 A1 | 6/2003 | Fitzgerald |
| 2008/0157345 A1 | 7/2008 | Lu |
| 2009/0146055 A1 | 6/2009 | Canfield |

(Continued)

FOREIGN PATENT DOCUMENTS

WO    2010104001 A1    9/2010

OTHER PUBLICATIONS

UK Search Report and Written Opinion dated Apr. 1, 2022, for GB Application No. GB2115785.4.

(Continued)

*Primary Examiner* — Sitaramarao S Yechuri
(74) *Attorney, Agent, or Firm* — Grant M. McNeilly

(57) ABSTRACT

A method of preparing a computer processor die includes determining a warpage shape of the computer processor die at a testing temperature. The method also includes selectively contouring a thickness of the computer processor die at a contouring temperature by physically removing material from a surface of the computer processor die such that the surface will be substantially flat at the testing temperature.

20 Claims, 7 Drawing Sheets

(56) References Cited

U.S. PATENT DOCUMENTS

| | | | | |
|---|---|---|---|---|
| 2009/0146359 A1* | 6/2009 | Canfield | ............ | G01R 31/2891 |
| | | | | 269/289 R |
| 2011/0174443 A1* | 7/2011 | Sri-Jayantha | ....... | A47J 37/1219 |
| | | | | 156/494 |
| 2013/0271169 A1* | 10/2013 | Colvin | ..................... | G01R 1/44 |
| | | | | 324/750.03 |
| 2013/0273674 A1* | 10/2013 | Colvin | .................. | B24B 37/013 |
| | | | | 451/5 |
| 2015/0309112 A1* | 10/2015 | Goh | .................. | G01R 31/2874 |
| | | | | 324/750.08 |
| 2015/0371969 A1* | 12/2015 | Yu | ........................ | H01L 23/562 |
| | | | | 438/106 |
| 2017/0287873 A1 | 10/2017 | Sankarasubramanian | | |

OTHER PUBLICATIONS

German Office Action Notice dated May 9, 2023, for German File No. 10 2021 125 845.6.

Kociniewski et al., "Mechanical and Thermal Stresses Characterization Maps on Cross-sections of Forward Biased Electronic Power Devices," 2015 IEEE International Reliability Physics Symposium, Apr. 19-23, 2015, pp. FA.2.1-FA.2.8.

* cited by examiner

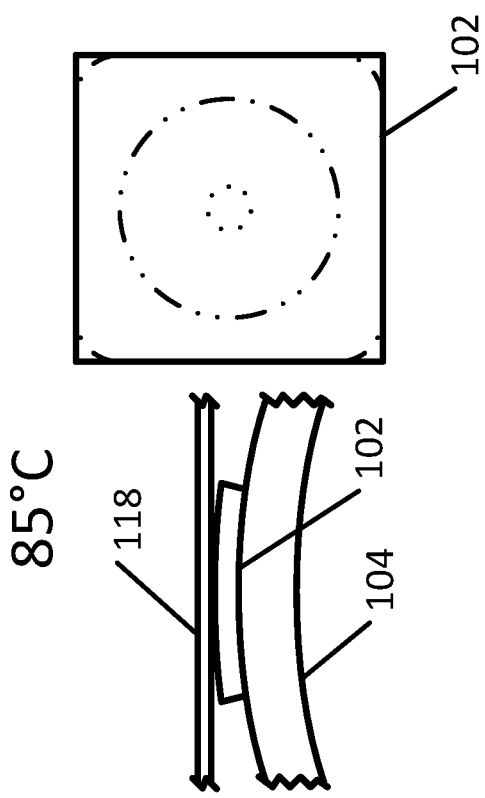
FIG. 2A (Prior Art) 25°C
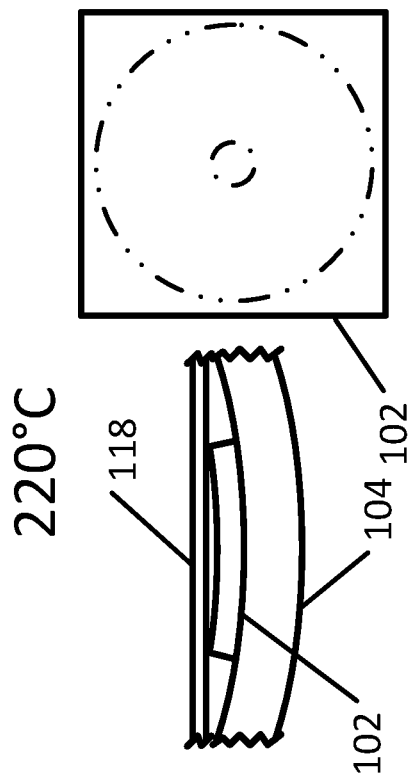
FIG. 2B (Prior Art) 85°C
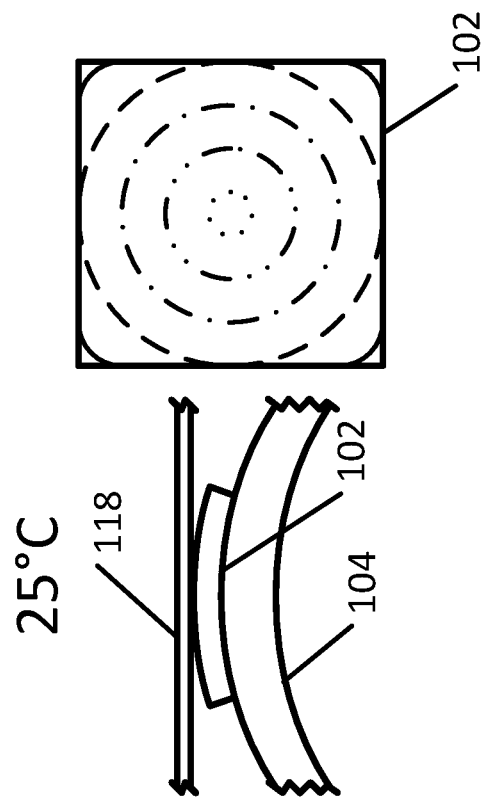
FIG. 2C (Prior Art) 160°C
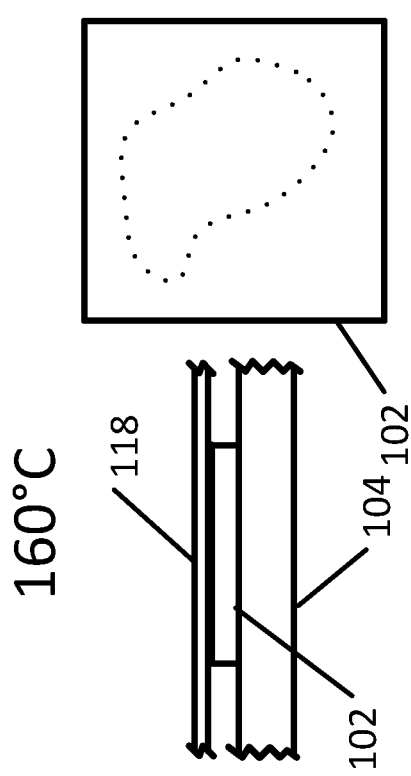
FIG. 2D (Prior Art) 220°C

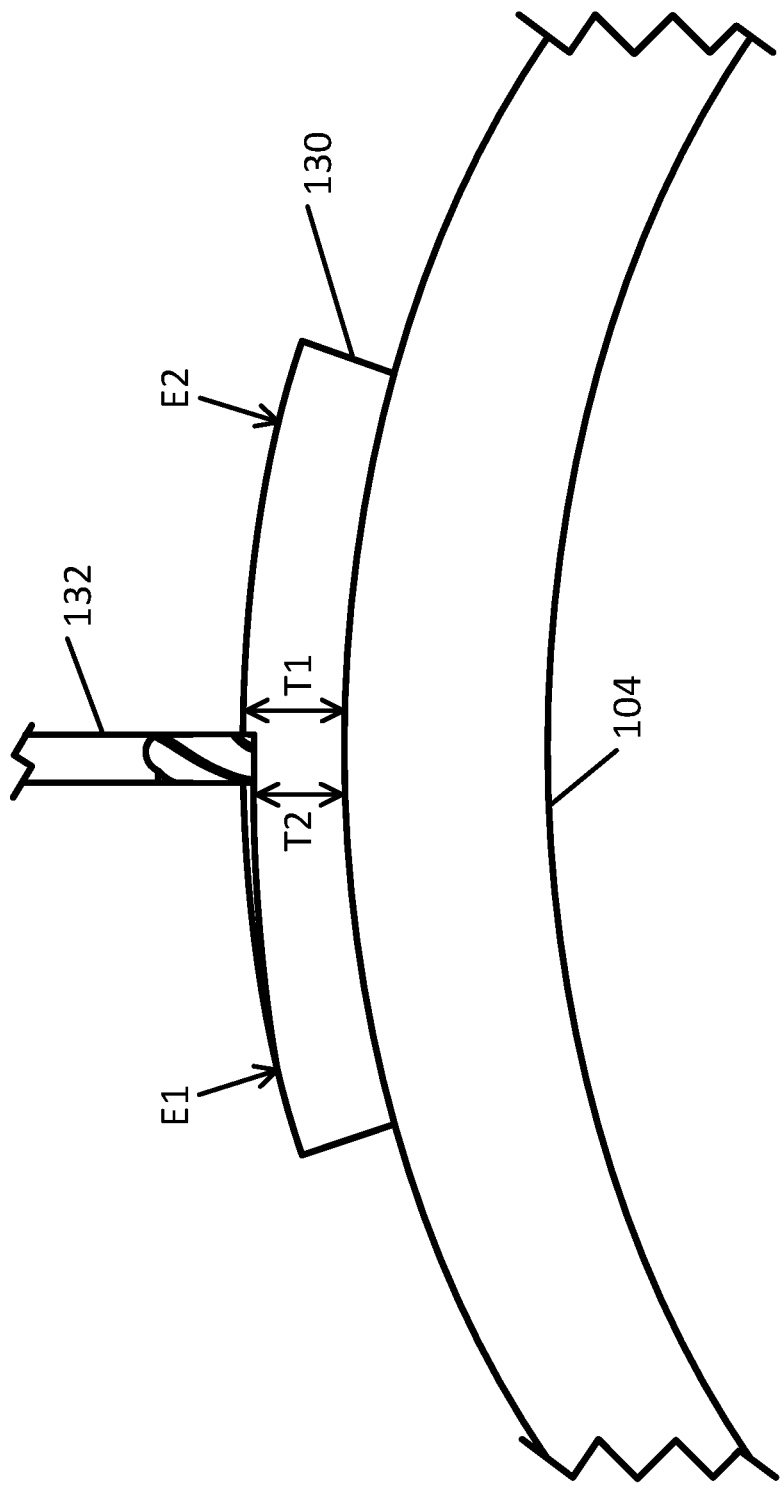

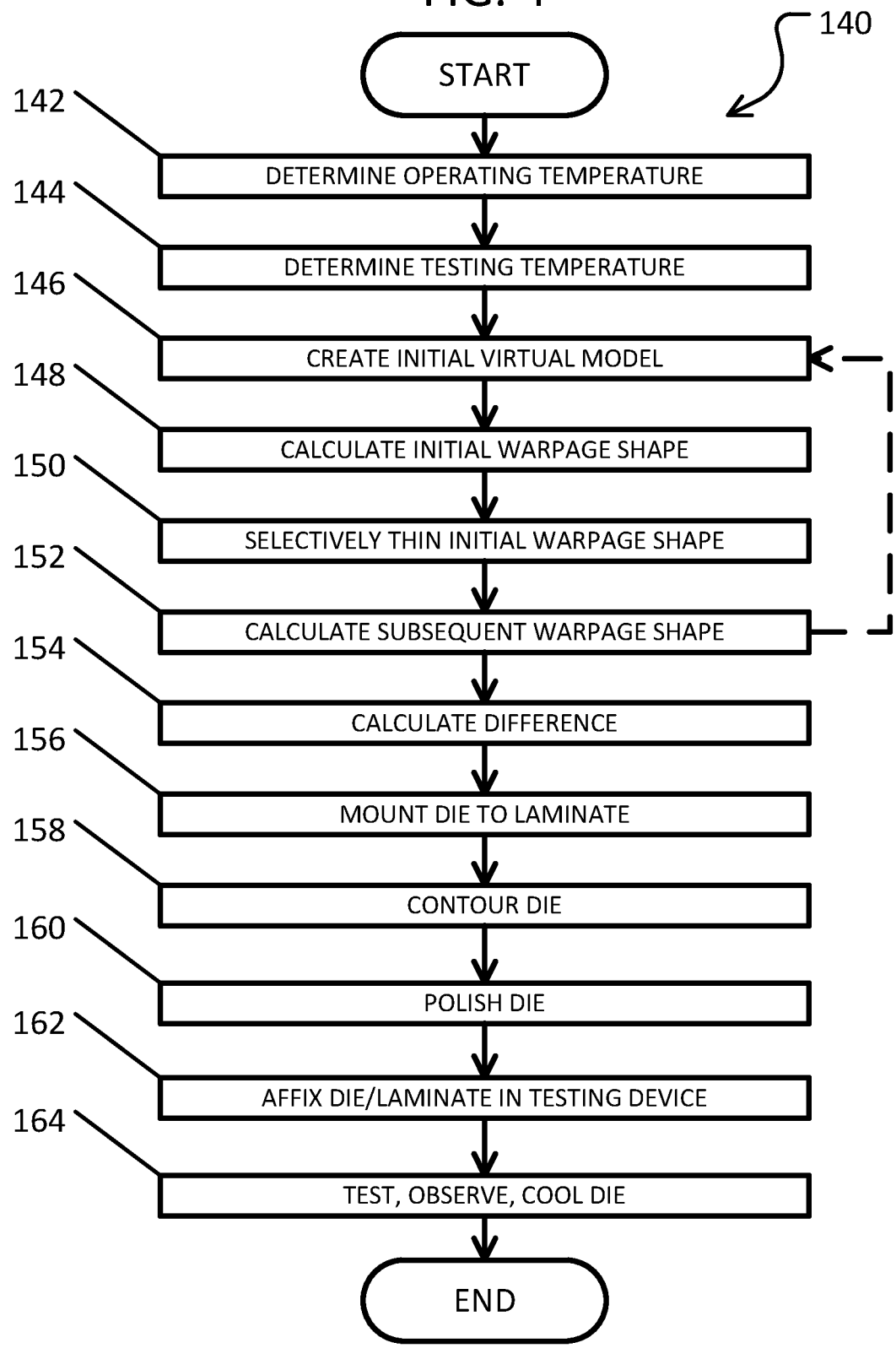

25°C

85°C

160°C

220°C

HIGH POWER DEVICE FAULT LOCALIZATION VIA DIE SURFACE CONTOURING

BACKGROUND

The present disclosure relates to computer processors, and more specifically, to device fabrication for testing processor designs.

Conventional methods for testing and analyzing electronic devices, such as microprocessors, can involve image-based fault localization tools, such as a laser scanning microscope (LSM) or a photon emission microscope (PEM). Using LSMs and PEMs can involve operating the device under test (DUT) at maximum frequency and power, so the DUT should be continuously cooled during testing. If cooling is inadequate, a thermal runaway can occur wherein the DUT temperature increases until the DUT fails.

In addition to cooling, there should be an optically clear path between the DUT and the microscope lens during testing so that the DUT can be observed. Unfortunately, such a path can prevent the use of common methods for heat removal, such as thermal interface materials and heat spreaders. Furthermore, for ultra-high-resolution imaging using LSMs and PEMs, a solid immersion lens (SIL) is typically used to make direct surface contact with the DUT backside, further complicating the task of cooling the DUT.

SUMMARY

According to an embodiment of the present disclosure, a method of preparing a computer processor die includes determining a warpage shape of the computer processor die at a testing temperature. The method also includes selectively contouring a thickness of the computer processor die at a contouring temperature by physically removing material from a surface of the computer processor die such that the surface will be substantially flat at the testing temperature.

According to an embodiment of the present disclosure, a method of preparing a computer processor die for testing includes heating the computer processor die to an initial temperature and attaching a shaping material to the computer processor die to maintain a shape of the computer processor die near the initial temperature. The method also includes selectively contouring a thickness of the computer processor die by physically removing material from a surface of the computer processor die, and separating the computer processor die from the shaping material.

According to an embodiment of the present disclosure, a system includes a computer processor die, a laminate material connected to the computer processor die, a daughter card electrically connected to the computer processor die to energize the computer processor die, a solid immersion lens in contact with a backside of the computer processor die, and a cooling plate in contact with the backside of the computer processor die. The backside of the computer processor die is substantially flat at an operating temperature of the computer processor die.

BRIEF DESCRIPTION OF THE DRAWINGS

FIGS. 2A-2D are pairs of a side elevation view (on the left sides) and a topographic map (on the right sides) of a device under testing (DUT) at different temperatures.

FIG. 3 is a side elevation view of an alternative die being contoured at room temperature, according to embodiments of the present disclosure.

FIG. 4 is a flowchart of a method of contouring a die, according to embodiments of the present disclosure.

DETAILED DESCRIPTION

Figure 1:
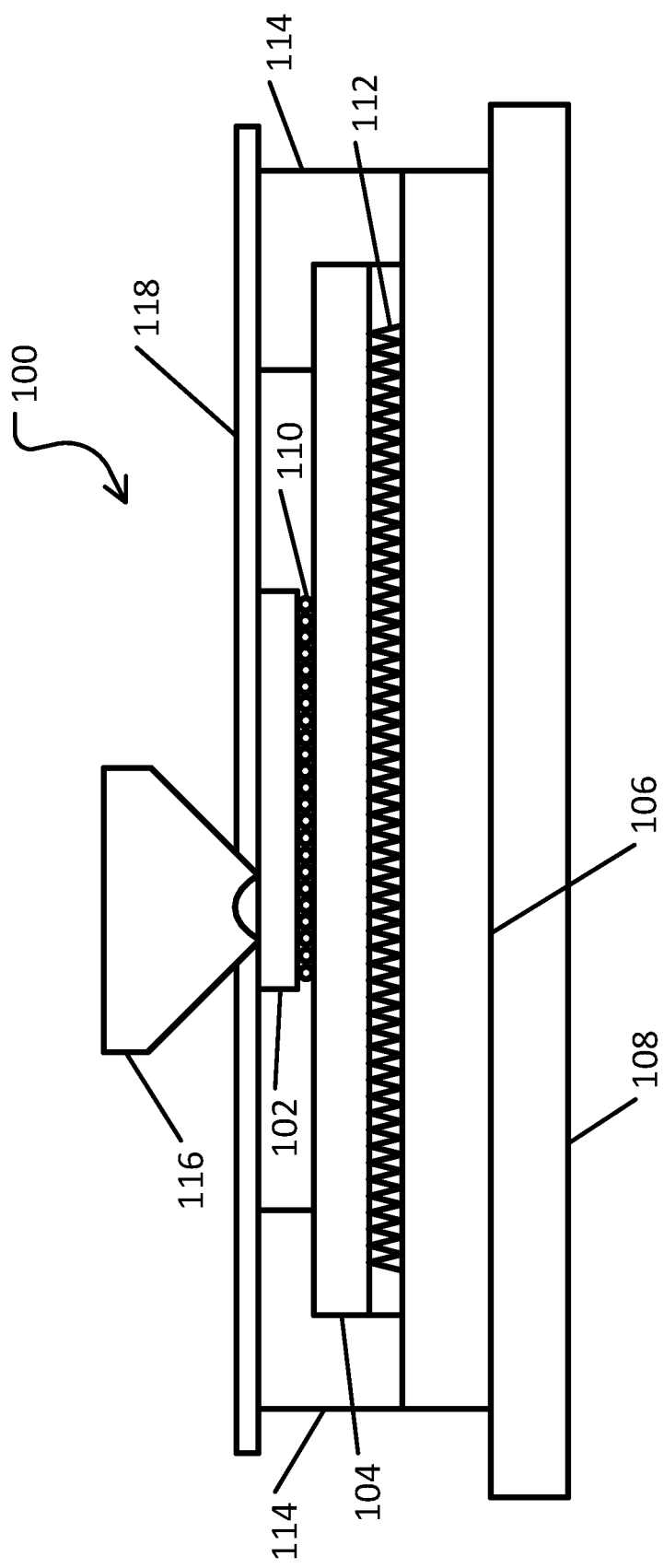
FIG. 1 is a side elevation view of a processor testing device, according to embodiments of the present disclosure.
Figure 5A:
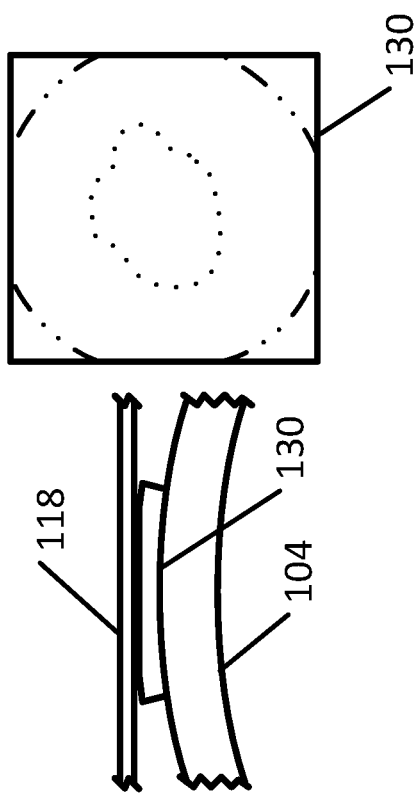
FIGS. 5A-5D are pairs of a side elevation view (on the left sides) and a topographic map (on the right sides) of a contoured device under testing (DUT) at different temperatures, according to embodiments of the present disclosure.
Figure 5B:
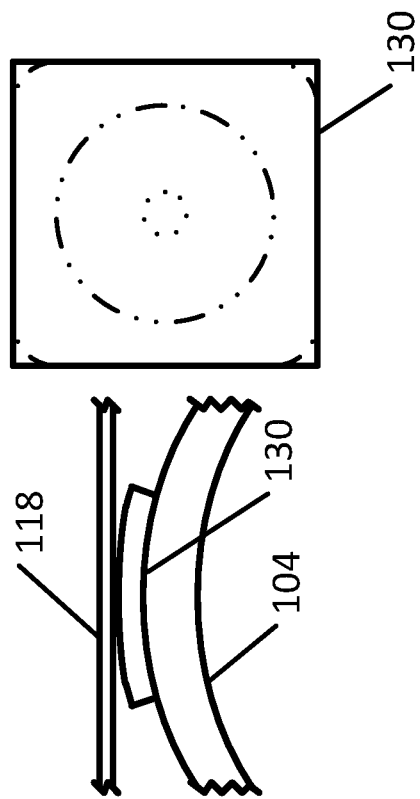
Figure 5C:
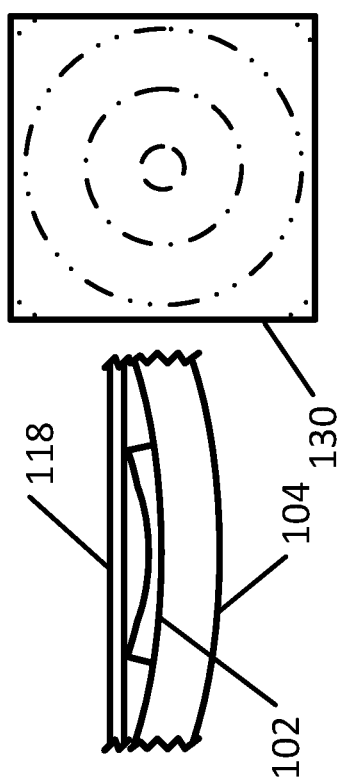
Figure 5D:
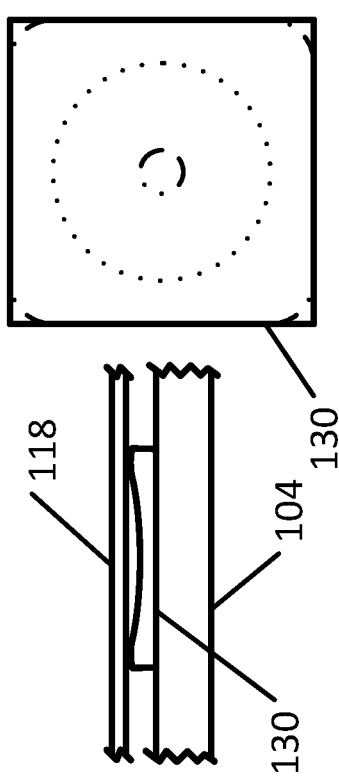

FIG. 1 is a side elevation view of testing device 100. In the illustrated embodiment, testing device 100 includes die 102, laminate 104, pogo interposer 106, and daughter card 108. In the depicted situation, die 102 is a microprocessor that is the DUT, so die 102 is electrically and structurally connected to laminate 104 with solder joints 110. Laminate 104 is electrically connected to pogo interposer 106 by pogo pins 112, and laminate 104 is structurally connected to pogo interposer 106 by clamping frame 114. Pogo interposer 106 is electrically and structurally connected to daughter card 108, so the electrical components of die 102 (not shown but positioned on the side of die 102 proximate laminate 104) can be selectively energized by daughter card 108.

In addition, testing device 100 includes SIL 116 which can move along the surface of die 102 proximate laminate 104 (i.e., "the backside" or "the upper side" of die 102, although such directional indicators are merely used in reference to the orientation of the components depicted in the Figures). Furthermore, testing device 100 includes cooling plate 118 which surrounds SIL 116 and moves therewith across the surface of die 102. Thereby, die 102 can be operated, tested, observed, and cooled in testing device 100.

FIGS. 2A-2D are pairs of a side elevation view (on the left sides) and a topographic map (on the right sides) of die 102 (the DUT) at different temperatures of 25° C., 85° C., 160° C., and 220° C., respectively. These views have been significantly exaggerated so that the properties described are more easily visible. In addition, to understand the topographic maps, different contour lines have been used to indicate different elevations. From lowest to highest, the lines patters are solid, only dashes, dash-dot, dash-dot-dot, and only dots.

In the illustrated embodiment, die 102 has a constant thickness, and it and laminate 104 have convex shapes at 25° C. (e.g., when die 102 is inactive) that vary from corner to center, for example, by approximately 85 μm. At 85° C. (e.g., when die 102 is operating normally), die 102 and laminate 104 are less convex and vary from corner to center, for example, by approximately 50 μm. At 160° C. (e.g., when die 102 is overheated), die 102 and laminate 104 are substantially flat. While die 102 can have small ripples on its backside due to uneven self-heating from the internal electrical activity, the substantial flatness can be, for example, less than approximately 10 μm. At 220° C. (e.g., when die 102 is extremely overheated) die 102 and laminate 104 have concave shapes and vary corner to center, for example, by approximately 20 μm.

Thereby, die 102 has extremely limited contact with cooling plate 118 at 25° C., and die 102 has limited contact with cooling plate 118 at 85° C. and 220° C. Die 102 has the most extensive contact with cooling plate 118 at 160° C. Unfortunately, this temperature can be significantly higher than the normal operating temperature of die 102 where testing would be most valuable. Because of the limited cooling available at 85° C., the temperature of die 102 may rise past 85° C. even under normal operating conditions since the techniques that would be used on a production device would not be available to cool die 102 in testing device 100 (shown in FIG. 1). More specifically, known industry methods to cool a DUT within testing device 100 (e.g., such as one that employs an LSM) involve direct contact between die 102 and cooling plate 118. However, die 102 can be very large with a complex surface topography which can cause loss of contact cooling (i.e., conduction) with cooling plate 118. Also, self-heating within die 102 can cause dynamic thermal warpage, resulting in loss of critical contact area and subsequent loss of cooling. Additionally, many direct contact cooling plate solutions (such as cooling plate 118) are not designed for ultra-high-power applications, and do not take into account significant non-uniform power dissipation such as found in large scale, multi-core server processors.

FIG. 3 is a side elevation view of alternative die 130 being contoured at approximately room temperature (e.g., 25° C.). In the illustrated embodiment, die 130 is connected to laminate 104 and can be at a temperature similar to that of FIG. 2A. Die 130 is being cut by tool 132, which selectively thins and contours die 130. This is shown by thickness T2 being smaller than thickness T1, which is the original uniform thickness of die 130 prior to contouring. Furthermore, edges E1 and E2 indicate the border of where the contouring operation takes place, outside of which remains noncontoured with thickness T1.

Laminate 104 and/or tool 132 can be secured and/or moved (e.g., rotated and/or translated in space) by a computer numerical control (CNC) machine (not shown) to selectively contour the backside of die 130. Tool 132 can be any suitable local material removal device. While tool 132 is depicted as an end mill, tool 132 can instead be, for example, a ball mill, a bur (e.g., carbide or diamond), a grinding stone, an abrasive stone, or a polishing wheel. In addition, multiple different tools 132 can be used sequentially, for example, to selectively remove material and then to polish the some or all of the backside of die 130 to a mirror finish. Thereby, die 130 can be shaped prior to testing in testing device 100 (shown in FIG. 1) so that die 130 is substantially flat at its operating temperature.

FIG. 4 is a flowchart of method 140 of contouring die 130. During the discussion of method 140, references may be made to the features shown in FIGS. 1-3.

At block 142, an operating temperature for die 130 is determined. The operating temperature can be, for example, the normal operating temperature for a production processor having the same design as die 130. At block 144, a testing temperature for die 130 is determined. The testing temperature can be, for example, substantially similar to the operating temperature (e.g., plus or minus 10° C.) or a substantially different temperature at which die 130 will be tested (e.g., to simulate start-up or overheating conditions). At block 146, a precedent virtual model of noncontoured die 130 is created using finite element analysis. At block 148, a precedent warpage shape of the noncontoured die 130 is calculated by analyzing the precedent virtual model at the testing temperature. At block 150, the precedent warpage shape is virtually selectively thinned to create a subsequent virtual model that will have a backside that is substantially flat at the testing temperature. At block 152, a subsequent warpage shape of die 130 is calculated by analyzing the subsequent virtual model at a contouring temperature (e.g., the temperature at which die 130 would be thinned, for example, at approximately room temperature). At block 154, the difference between noncontoured die 130 and the subsequent warpage shape is calculated to determine the amount of material to remove at varying locations across the backside of die 130.

At block 156, noncontoured die 102 is mounted to laminate 104. At block 158, die 102 is contoured at the contouring temperature, for example, by removing material from its backside to create contoured die 130 such that die 130 matches the subsequent warpage shape. This will cause die 130 to have the same shape as the subsequent virtual model so that die 130 will be substantially flat at the testing temperature. At block 160, the backside of die 130 is polished, for example, to a mirror finish. At block 162, laminate 104 (with die 130) is then affixed in testing device 100 by connecting laminate 104 to pogo interposer 106. Once affixed, the backside of die 130 is in contact with cooling plate 118. At block 164, die 130 is tested by electrically energizing and operating die 130 while being observed by SIL 116 and cooled by cooling plate 118.

Method 140 allows for die 130 to be selectively thinned by virtually modeling a noncontoured die at a common temperature (e.g., room temperature), virtually heating die 130, virtually modifying die 130 to be substantially flat at the raised temperature, virtually cooling die 130, and calculating the material that would need to be removed at the common temperature. In addition, some alternative embodiments include blocks 146-152 being iteratively repeated one or more times, as indicated by the phantom arrow. This can further refine the shape of die 130 to increase the contact and heat transfer between die 130 and cooling plate 118. In each iteration, the subsequent virtual model becomes the precedent virtual model for the next iteration.

FIGS. 5A-5D are pairs of a side elevation view (on the left sides) and a topographic map (on the right sides) of die 130 (the DUT) at different temperatures of 25° C., 85° C., 160° C., and 220° C., respectively. These views have been significantly exaggerated so that the properties described are more easily visible. In addition, to understand the topographic maps, different contour lines have been used to indicate different elevations. From lowest to highest, the lines patters are solid, only dashes, dash-dot, dash-dot-dot, and only dots.

In the illustrated embodiment, die 130 has a selectively thinned thickness, and it and laminate 104 have convex shapes at 25° C. (e.g., when die 130 is inactive) that vary from corner to center, for example, by approximately 50 μm. At 85° C. (e.g., when die 130 is operating normally), laminate 104 is less convex and die 130 is substantially flat. While, die 130 can have small ripples on its backside due to uneven self-heating from the internal electrical activity, the substantial flatness can be, for example, less than approximately 10 μm. At 160° C. (e.g., when die 130 is overheated), laminate 104 are substantially flat and die 130 has a concave shape and vary corner to center, for example, by approximately 40 μm. At 220° C. (e.g., when die 130 is extremely overheated) die 102 and laminate 104 have concave shapes and vary corner to center, for example, by approximately 60 μm.

Die 130 has an operating temperature of 85° C., so die 130 has been selectively thinned to be substantially flat at 85° C. However, if a different operating temperature is desired or predicted, method 140 can be performed again using the new temperature. Thereby, die 130 can be substantially flat at the new temperature, which is not possible with known methods, such as having a constant thickness die (as shown in FIGS. 2A-2D) or simply flattening the die at room temperature (not shown).

FIGS. 6A-6D are a series of side elevation views of die 102 being contoured on mount 172, transforming it to die 170. Mount 172 comprises stud 174 and shaper 176 and is connected to laminate 104. Stud 174 is a rigid plate, for example, made from steel or aluminum.

In the illustrated embodiment, shaper 176 is a material that is formable at a relatively low temperature but solid at room temperature. More specifically, shaper 176 can solidify, dry, and/or cure at a temperature that is similar to the operating temperature of die 170 (e.g., plus or minus 10° C.), so shaper 176 can be solid at the contouring temperature but hold the shape of die 170 at or near its operating temperature. Therefore, shaper 176 can comprise, for example, a thermoset polymer material (e.g., resin) or a thermoplastic polymer material (e.g., wax).

To affix mount 172 to laminate 104, laminate 104 and die 170 can be heated (e.g., by operation of die 170 or by an external source such as an oven) and placed proximate to stud 174. Then shaper 176, in liquid form, can be poured between stud 174 and laminate 104. Then shaper 176 solidifies, dries, and/or cures and adheres laminate 104 to stud 174. In alternative embodiments, shaper 176 is shaped as a solid to approximately the shape of laminate 104 at the operating temperature of die 170. Then shaper 176 is adhered to stud 174, and the heated laminate 104 is adhered to shaper 176. The adhering of laminate 104 to shaper 176 can occur, for example, by pressing laminate 104 onto shaper 176, locally melting the surface of shaper 176. For another example, a thin layer of adhesive (e.g., glue) (not shown) is added in between shaper 176 and laminate 104 to adhere them together.

Figure 6A:
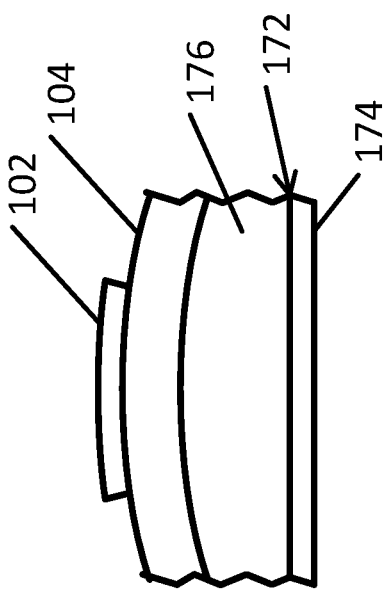
FIGS. 6A-6D are a series of side elevation views of an alternative die being contoured on a mount, according to embodiments of the present disclosure.
Figure 6B:
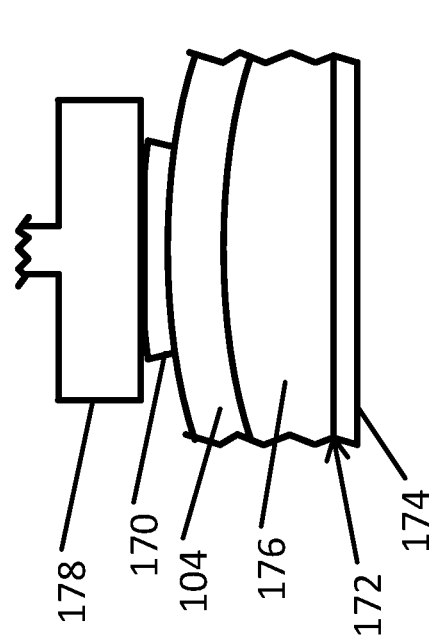

Referring to FIG. 6B, die 170 is being cut in a planar fashion by tool 178. This action selectively thins and contours die 170 to be substantially flat at the operating temperature of die 170. This operation can occur at approximately room temperature because die 170 is physically constrained in the shape it would be in at the operating temperature. In the illustrated embodiment, stud 174 and/or tool 178 can be secured and/or moved (e.g., rotated and/or translated in space) by a computer numerical control (CNC) machine (not shown) to selectively contour the backside of die 170. Tool can be any suitable local or planar material removal device. While tool 178 is depicted as grinding tool, tool 132 can instead be, for example, an end mill, a fly cutter, a bur (e.g., carbide or diamond), an abrasive stone, or a polishing wheel. In addition, multiple different tools 178 can be used sequentially, for example, to selectively remove material and then to polish the some or all of the backside of die 170 to a mirror finish.

Figure 6C:
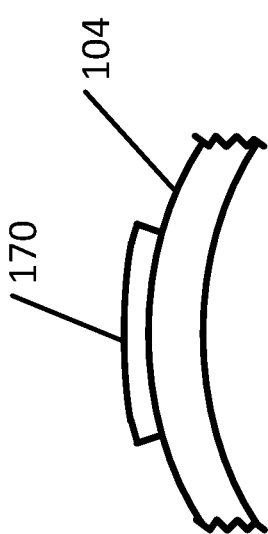

Referring to FIG. 6C, after die 170 is contoured, mount 172 is removed from laminate 104, for example, by removing shaper 176. In some embodiments, shaper 176 is removed by chemical (e.g., dissolving), thermal (e.g., heating), and/or mechanical (e.g., cutting) processes. After mount 172 is disconnected, laminate 104 and die 170 assume their natural shape at approximately room temperature, which can be more convex than at the testing temperature.

Figure 6D:
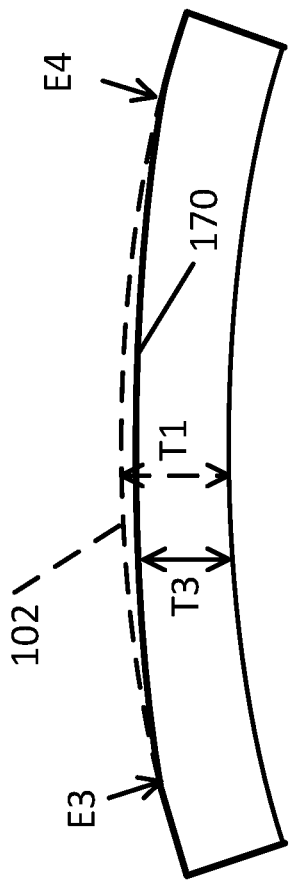

The difference between die 170 before and after contouring is shown in FIG. 6D by thickness T3 being smaller than thickness T1 (shown in phantom). Furthermore, edges E3 and E3 indicate the border of where the contouring operation takes place, outside of which remains noncontoured with thickness T1. Therefore, the contoured shape of die 170 allows die to exhibit the same or similar behavior to die 150 (shown in FIGS. 5A-5D).

Figure 7:
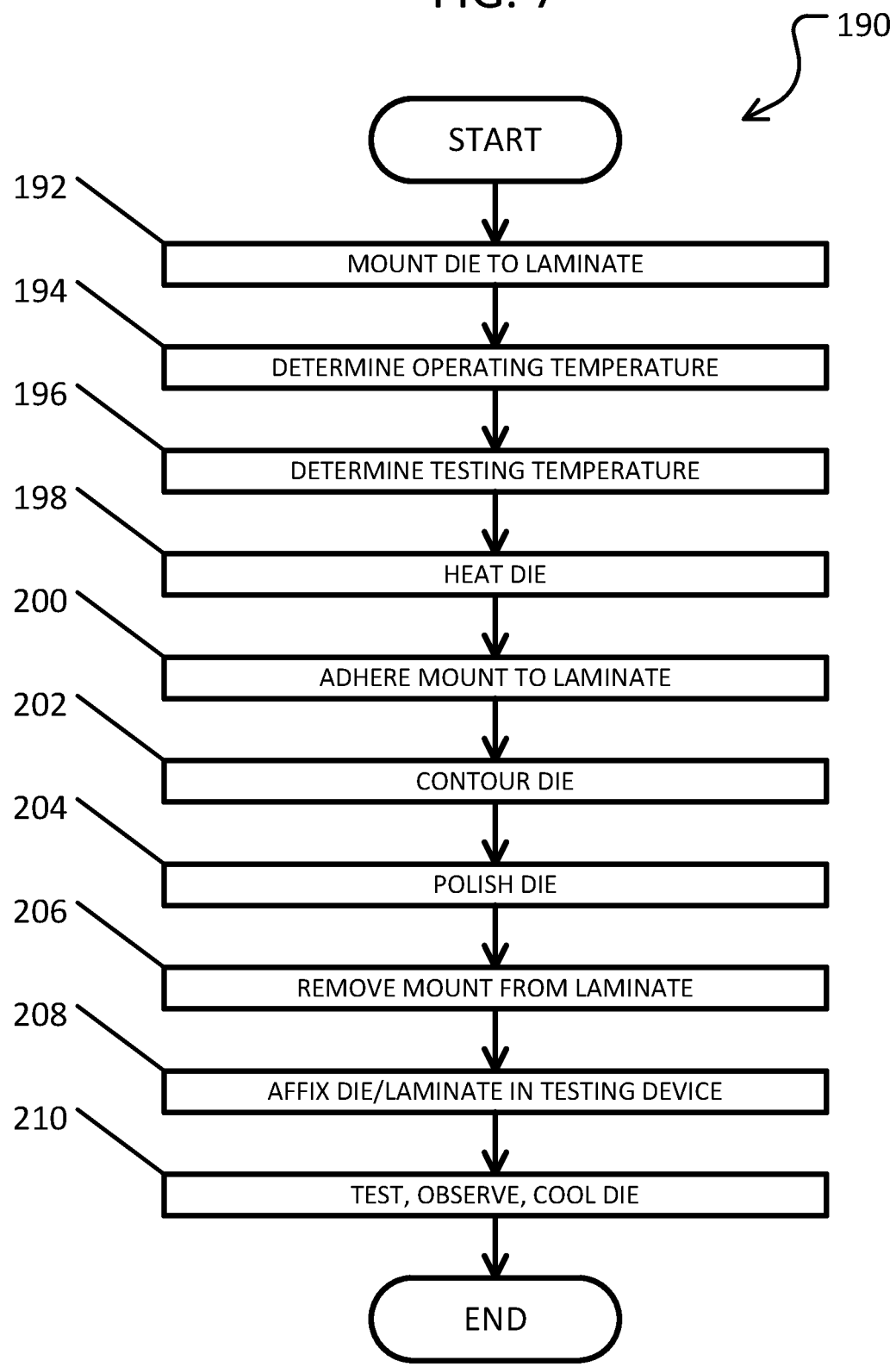
FIG. 7 is a flowchart of an alternative method of contouring a die, according to embodiments of the present disclosure.

FIG. 7 is a flowchart of alternative method 190 of contouring die 170. During the discussion of method 190, references may be made to the features shown in FIGS. 1, 2, 5A-5D, and 6A-6C.

At block 192, die 170 is mounted to laminate 104. At block 194, an operating temperature for die 170 is determined. The operating temperature can be, for example, the normal operating temperature for a production processor having the same design as die 170. At block 196, a testing temperature for die 170 is determined. The testing temperature can be, for example, substantially similar to the operating temperature (e.g., plus or minus 10° C.) or a substantially different temperature at which die 170 will be tested (e.g., to simulate start-up or overheating conditions).

At block 198, die 170 is heated to an initial temperature, for example, by operating die 170 or by using an external heat source (e.g., an oven). The initial temperature can be the same as or similar to (e.g., plus or minus 10° C.) the operating temperature of die 170. The initial temperature can also be the same as or similar to (e.g., plus or minus 10° C.) the solidification, desiccation, and/or cure temperature of shaper 176 or any adhesives used to bind shaper 176 to laminate 104 at a temperature that is similar to the operating temperature of die 170 (e.g., plus or minus 10° C.). At block 200, laminate 104 is adhered to stud 174 and shaper 176. Block 200 can occur, for example, by pouring a liquid shaper 176 between laminate 104 and stud 174 and allowing shaper 176 to solidify, dry, and/or cure while holding die 170 at or near its operating temperature. For another example, block 200 can occur by applying adhesive to stud 174, shaper 176, and/or laminate 104 and allowing the adhesive to solidify, dry, and/or cure while maintaining die 170 at or near its operating temperature. Thereby, block 200 may include heating of shaper 176 above its solidification temperature and/or mixing of multiple chemical parts that will dry and/or cure over time.

At block 202, after shaper 176 has solidified, dried, and/or cured, noncontoured die 170 is contoured at the contouring temperature, for example, by removing material from its backside so that contoured die 170 is substantially flat. Even though die 170 is flattened at the contouring temperature, die 170 will be substantially flat at the testing temperature because die 170 is being warped by shaper 176. At block 204, the backside of die 170 is polished, for example, to a mirror finish. At block 206, mount 172 is separated from laminate 104 by chemical (e.g., dissolving), thermal (e.g., heating), and/or mechanical (e.g., cutting) processes performed on shaper 176. At block 208, laminate 104 (with die 170) is then affixed in testing device 100 by connecting laminate 104 to pogo interposer 106. Once affixed, the backside of die 170 is in contact with cooling plate 118. At block 210, die 170 is tested by electrically energizing and operating die 170 while being observed by SIL 116 and cooled by cooling plate 118.

Method 190 allows for die 170 to be selectively thinned by bringing die 170 to or near its operating temperature, holding die 170 in its warped shape using shaper 176, cooling die 170 to a contouring temperature (e.g., room temperature), flattening die 170, and releasing die 170 and laminate from shaper 176. Thereby, method 190 can contour of die 170 to increase the contact and heat transfer between die 170 and cooling plate 118.

In the illustrated embodiment, die 170 has an operating temperature of 85° C., so die 170 has been selectively thinned to be substantially flat at 85° C. However, if a different operating temperature is desired or predicted, a different shaper 176 can be used, for example, one with a different solidification, desiccation, and/or cure temperature or one with a different shape. Thereby, die 170 can be substantially flat at the new temperature, which is not possible with known methods, such as having a constant thickness die (as shown in FIGS. 2A-2D) or simply flattening the die at room temperature (not shown).

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of preparing a computer processor die, the method comprising:
    determining a first warpage shape of the computer processor die at a testing temperature; and
    contouring, selectively, a thickness of the computer processor die at a contouring temperature by physically removing material from a surface of the computer processor die such that the surface will be substantially flat at the testing temperature;
    wherein the contouring temperature is room temperature.

2. The method of claim 1, further comprising:
    determining an operating temperature of the computer processor die;
    wherein the testing temperature is within 10 degrees Celsius of the operating temperature.

3. The method of claim 1, further comprising:
    testing the computer processor die at the testing temperature by operating the computer processor die.

4. The method of claim 3, further comprising:
    contacting the surface of the computer processor die with a cooling plate;
    cooling the computer processor die during the testing of the computer processor die using the cooling plate.

5. The method of claim 1, wherein contouring, selectively, the thickness of the computer processing die is performed based on the first warpage shape.

6. The method of claim 1, wherein determining the first warpage shape comprises:
    creating a first virtual model of the computer processor die using finite element analysis; and
    contouring, selectively, the first virtual model to create a second virtual model such that a virtual surface of the second virtual model will be substantially flat at the testing temperature.

7. The method of claim 6, further comprising:
    determining a second warpage shape of a second virtual model at the testing temperature; and
    selectively thinning and/or thickening the second virtual model to create a third virtual model such that the virtual surface will be substantially flat at the testing temperature.

8. The method of claim 7, wherein contouring, selectively, the thickness of the computer processing die is performed based on the third virtual model.

9. The method of claim 1, wherein the testing temperature is higher than the contouring temperature.

10. A method of preparing a computer processor die for testing, the method comprising:
    heating the computer processor die to an initial temperature;
    attaching a shaping material to the computer processor die to maintain a shape of the computer processor die near the initial temperature wherein attaching comprises:
        pouring the shaping material between a stud and the computer processor die; and
        allowing the shaping material to solidify, dry, and/or cure;
    contouring, selectively, a thickness of the computer processor die by physically removing material from a surface of the computer processor die; and
    separating the computer processor die from the shaping material.

11. The method of claim 10, further comprising:
    determining an operating temperature of the computer processor die;
    wherein the initial temperature is within 10 degrees Celsius of the operating temperature.

12. The method of claim 10, further comprising:
    testing the computer processor die at a testing temperature by operating the computer processor die.

13. The method of claim 12, further comprising:
    contacting the surface of the computer processor die with a cooling plate;
    cooling the computer processor die during the testing of the computer processor die using the cooling plate.

14. The method of claim 10, further comprising:
    heating the shaping material above a solidification temperature of the shaping material.

15. The method of claim 14, wherein the heated shaping material heats the computer processor die to the initial temperature.

16. The method of claim 10, wherein the computer processor die is heated to the initial temperature by operating the computer processor die.

17. The method of claim 10, wherein contouring, selectively, the thickness of the computer processor die by physically removing material from the surface of the computer processor die comprises flattening the surface.

18. The method of claim 10, wherein separating the computer processor die from the shaping material comprises at least one of the group consisting of: heating the shaping material and dissolving the shaping material.

19. The method of claim 10, wherein the shaping material is a wax.

20. A system comprising:
    a computer processor die;
    a laminate material connected to the computer processor die;
    a daughter card electrically connected to the computer processor die to energize the computer processor die;
    a solid immersion lens in contact with a backside of the computer processor die; and
    a cooling plate in contact with the backside of the computer processor die;
    wherein the backside of the computer processor die is substantially flat at an operating temperature of the computer processor die.

* * * * *